United States Patent [19]
Roche

[11] Patent Number: 4,782,787
[45] Date of Patent: Nov. 8, 1988

[54] APPARATUS FOR LASER-INDUCED CHEMICAL VAPOR DEPOSITION

[76] Inventor: Gregory A. Roche, 4287 Dry Bed Ct., Santa Clara, Calif. 95054

[21] Appl. No.: 817,072

[22] Filed: Jan. 8, 1986

[51] Int. Cl.⁴ .................... C23C 16/48; C23C 16/52
[52] U.S. Cl. ................................. 118/722; 118/501; 118/728; 219/121.82; 219/121.61; 219/121.73; 219/121.75; 219/121.77
[58] Field of Search ............... 118/722, 728, 50.1; 427/53.1; 219/121 LA, 121 LM, 121 FS, 121 LH, 121 LJ, 121 LX, 121 LP, 121 LR, 121 LT; 204/157.41, 157.61

[56] References Cited
U.S. PATENT DOCUMENTS
4,579,750  4/1986  Bowen et al. ............. 204/157.61 X
4,664,057  5/1987  Hemmati ..................... 118/50.1

*Primary Examiner*—Evan K. Lawrence
*Attorney, Agent, or Firm*—Ellsworth R. Roston; Charles H. Schwartz

[57] ABSTRACT

An apparatus wherein a beam of substantially coherent light passes through a window in a chamber and then through the chamber in a direction substantially parallel, and contiguous, to substrates in the chamber. The beam ionizes gases in a mixture in the chamber. The ionized gases combine to form a substance which becomes deposited on the substrate(s) as a layer or which etches a previously deposited layer on the substrate. As the beam moves through the chamber, it loses energy. Various individual, or combinations of, compensations for this loss of energy may include the following: (1) the substrate(s) may be tilted slightly to decrease the distance between the beam and the substrate(s) as the beam moves through the chamber; (2) the beam may be tapered in a direction along the substrate(s); (3) the rate and direction of the flow of a mixture of ionizable gases through the chamber may be adjusted; (4) the rate and direction of flow of a gas for neutralizing the ionization of the gases may be adjusted; (5) the rate of flow of the ionizable gases may be individually adjusted for each substrate; (6) the rate and direction of flow of the neutralizing gas may be individually adjusted for each substrate; and (7) the beam may be regulated by splitting it between two compartments of the chamber.

38 Claims, 5 Drawing Sheets

APPARATUS FOR LASER-INDUCED CHEMICAL VAPOR DEPOSITION

This invention relates to apparatus for, and methods of, producing a substantially uniform, pure and stable deposition of a substance on a substrate. The invention particularly relates to apparatus for, and methods of, providing an energy beam to produce a substantially uniform, pure and stable deposition of a substance on a substrate, or aligned substrates, in a chamber even though the strength of the energy beam may vary at progressive positions along the substrate or substrates in the chamber.

In the manufacture of integrated circuit chips, substrates or wafers made from a suitable material are provided. Successive layers of materials are then deposited on the substrates. For example, layers of silicon dioxide may be deposited on the substrates to provide electrical insulation and layers of aluminum may be deposited on the surface to provide electrical continuity. Suitable materials such as acids may then be applied to the substrates in patterns to etch the aluminum on the substrates and thereby produce electrical circuits.

In depositing substances on a substance, ionizable gases may be introduced into a chamber. An energy beam may then be introduced into the chamber to ionize the gases. The ionized gases may then combine to form the substance, which becomes deposited on the substrates in the chamber. The substance thus produced may be a suitable gas such as silicon dioxide which becomes deposited on the substrates or the substance may be a suitable material such as an acid which etches layers previously deposited on the substrates.

Various types of apparatus and methods have been developed, and are presently in use, for depositing a substance such as silicon dioxide on a substrate such as a silicon wafer. Such apparatus and methods are disadvantageous in several respects. They require high temperatures in a chamber holding the substance to obtain the formation of the substance and the deposition of the substance on the substrate(s). Such high temperatures are undesirable because they produce warpage of the substrate(s) and increase the tendency for the substance to become deposited in the chamber at other places than on the substrate(s). Such high temperatures are also undesirable because they increase the difficulty in obtaining a substantially uniform, pure and stable deposition of the substance on the substrate(s). Such high temperatures have to be applied for a relatively long period, thereby aggravating the deleterious affects of having to operate at righ high temperatures. The apparatus of the prior art is also disadvantages because they produce radiation damage of the substrates. Furthermore, impurities tend to be produced in the materials deposited on the substrates because of inherent limitations in the apparatus of the prior art.

In recognition of the disadvantages discussed in the previous paragraph, apparatus and methods have been developed, and are in use, for depositing a substance on a substrate by techniques of chemical vapor deposition. Some of such apparatus and methods even provide for a deposition of the substance on the substrate at low temperatures. Such apparatus and methods are also disadvantageous because they do not produce a substantially uniform, pure and stable deposition of the substance on the substrate.

In copending application Ser. No. 587,284 filed by me on Mar. 7, 1984, for "Apparatus and Method for Laser-Induced Chemical Vapor Deposition", now U.S. Pat. No. 4,581,248, apparatus and methods are disclosed and claimed for producing a substantially uniform, pure and stable deposition of a substance on substrates in a chamber at low temperatures. In the apparatus and methods disclosed and claimed in U.S. Pat. No. 4,581,248, a beam of substantially coherent light is directed along the substrates in substantially parallel, and contiguous, relationship to the substrates to obtain the formation of the substance from the gases and the deposition of the substance on the substrates. Heat is directed on a localized basis to the substrates in a direction substantially perpendicular to the substrates to facilitate the deposition of the substance on the substrates. The substrate can be adjusted in position relative to the light beam to optimize the deposition on the substance on the substrate. The substance deposited on the substrates can constitute an additional layer on the substrates or it can etch a layer previously deposited on the substrates.

The apparatus of U.S. Pat. No. 4,581,248 is further advantageous in that it maximizes the cleanliness of the deposit on the substrates by limiting the deposition only to the substrates and inhibiting the deposition of the substances on the walls of the chamber. The invention of U.S. Pat. No. 4,581,248 is further advantageous in that no radiation damage is produced on the substrate by the use of laser techniques and by the direction of the laser in a direction substantially parallel to the substrates.

This invention provides a number of improvements in the apparatus and methods disclosed and claimed in U.S. Pat. No. 4,581,248. Such improvements are designed to enhance the uniformity, purity and stability of the substance deposited on the substrates in a chamber by compensating for the progressive weakening of the energy beam as the energy beam moves along the substrates. Such improvements are further designed to enhance the efficiency in the operation of such apparatus and in such methods from several different standpoints in addition to enhancing the uniformity, stability and purity of the substance deposited on the substrates in the chamber. These include the number of substrates capable of receiving a deposition of the substance at any one time and the rate at which the substance can be deposited uniformly on such substrates.

In one embodiment of the invention, a beam of substantially coherent light passes through a window in a chamber and then through the chamber in a direction substantially parallel, and contiguous, to a substrate (or substrates) in the chamber. The beam ionizes gases in a mixture in the chamber. The ionized gases combine to form a substance which becomes deposited on the substrate(s) to form a layer on the substrate(s) in the chamber or which etches a previously deposited layer on the substrates. As the beam moves through the chamber, it loses energy.

Various individual, or combinations of, compensations for the loss of energy in the beam may include: (1) the substrate(s) may be tilted slightly in the chamber to decrease the distance between the beam and the substrate(s) as the beam moves through the chamber; (2) the beam may be tapered in a direction along the substrate(s); (3) the rate and direction of the flow of a mixture of ionizable gases through the chamber may be adjusted; (4) the rate and direction of flow of a gas for neutralizing the ionization of the gases in the mixture may be adjusted; (5) the rate of flow of the gases in the mixture may be individually adjusted for each of the substrates in the chamber; and (6) the rate and direction of flow of the neutralizing gas may be individually adjusted for each of the substrates in the chamber. Lenses may be included in the window for producing the desired configuration of the energy beam.

In another embodiment, the chamber may be disposed within a compartment. A first portion of the beam may be directed through the chamber. A second portion of the beam may be directed through the compartment area external to the chamber and may then be redirected to pass through the chamber in a direction opposite to the first portion and at positions substantially parallel, and contiguous, to the substrate(s) in the chamber.

In one embodiment of the invention, a member generally indicated at 10 is provided for producing a beam of substantially coherent light, preferably in the ultraviolet range. The term "beam of substantially coherent light" is used advisedly since it may not be advantageous to have the light completely coherent. One reason is that completely coherent light may establish standing waves along the substrate and these standing waves may inhibit a uniform deposition of the substance on the substrate.

The member 10 may be a commercially available laser such as a Lumonics 850T Excimer laser. The laser beam may be pulsed at a suitable repetition rate such as 100 hertz and may be operated on the 193 nm ArF line. The laser beam may be directed through lenses 11 toward substrates 12, such as integrated circuit wafers, in a chamber 18. Each of the substrates may be provided with a flat periphery 12a (FIG. 12) to facilitate a precise positioning of the substrate on a support plate 14 in the chamber 18. Each support plate 14 may define the periphery of a window 16 in the chamber 18.

The light from the laser 10 may be directed to a beam splitter 15 which transmits most of the light incident upon it and reflects a selected portion, which may be ten percent (10%) to fifteen percent (15%), to a photodetector 17. The output of the photodetector 17 is proportional to the power of the beam from the laser 10 and is introduced to a power meter 19 for monitoring the power output from the laser 10.

The beam of substantially coherent light is preferably shaped before it is directed to the substrate(s) 12. This shaping is preferably accomplished by the lenses 11 to produce a light beam 28 which is substantially parallel, and contiguous, to the substrates 12 in the chamber 18 and which is as wide as the lateral dimension of each of the substrates. To shape the beam in the lateral direction, the lenses 11 may be provided with a suitable configuration to widen the beam in the lateral dimension. Preferably the surface to be coated on each substrate 12 is substantially flush with the surface of the supporting plate 14. In this way, the gases moving past the substrates 12 in the chamber 18 have a substantially uniform flow rather than being subjected to turbulence such as trends to occur when the surface to be coated on the substrates 12 is not substantially flush with the surface of the plates 14.

A nozzle 30 is disposed in the chamber 18 preferably in contiguous relationship to the substrate 12 at one end of the chamber. Preferably the nozzle 30 is disposed at the far end of the chamber 18 in the direction of passage of the light beam 28 through the chamber. Alternatively, the nozzle 30 may be disposed at the near end of the chamber in the direction of movement of the light beam 28. Furthermore, the nozzle 30 is preferably disposed at substantially the same vertical level as the top surfaces of the substrates 12 in the chamber 18 and is adapted to introduce ionizable gases under pressure in a direction substantially parallel to the substrates.

The nozzle 30 is adapted to introduce a mixture of ionizable gases which react to form the substance when energized at a relatively high energy level such as by the light beam 28. For example, when the substance to be deposited on the substrates 12 is silicon dioxide, the gases may be a silicon donor such as silane ($SiH_4$) in nitrogen and an oxygen donor such as nitrous oxide ($N_2O$). The gas such as silane in nitrogen may be obtained from a source 29 and the gas such as nitrous oxide may be obtained from source 31 and these gases may be mixed in the nozzle 30.

An orifice 32 is also disposed in the chamber 18, preferably in contiguous relationship to the substrates 12 at a second end of the chamber opposite the nozzle 30. The orifice 32 is preferably disposed at a substantially the same vertical level as the top surfaces of the substrates 12 in the chamber 18. By providing the nozzle 30 and the orifice 32 at opposite ends of the chamber 18 and in contiguous relationship to the substrates 12, an efficient flow of gas is obtained along the substrates for energizing the light beam 28. Such an arrangement of the nozzle 30 and the orifice 32 is also advantageous in that the gas flows tend to be localized such that the substance formed from the ionization of the donor gases tends to be deposited substantially only on the substrates 12. This minimizes any tendency for the substance to be deposited on other members. As will be appreciated, the deposition of the substance on such other members may interfere with the efficient operation of the apparatus constituting this invention.

Figures 1, 2, 3:
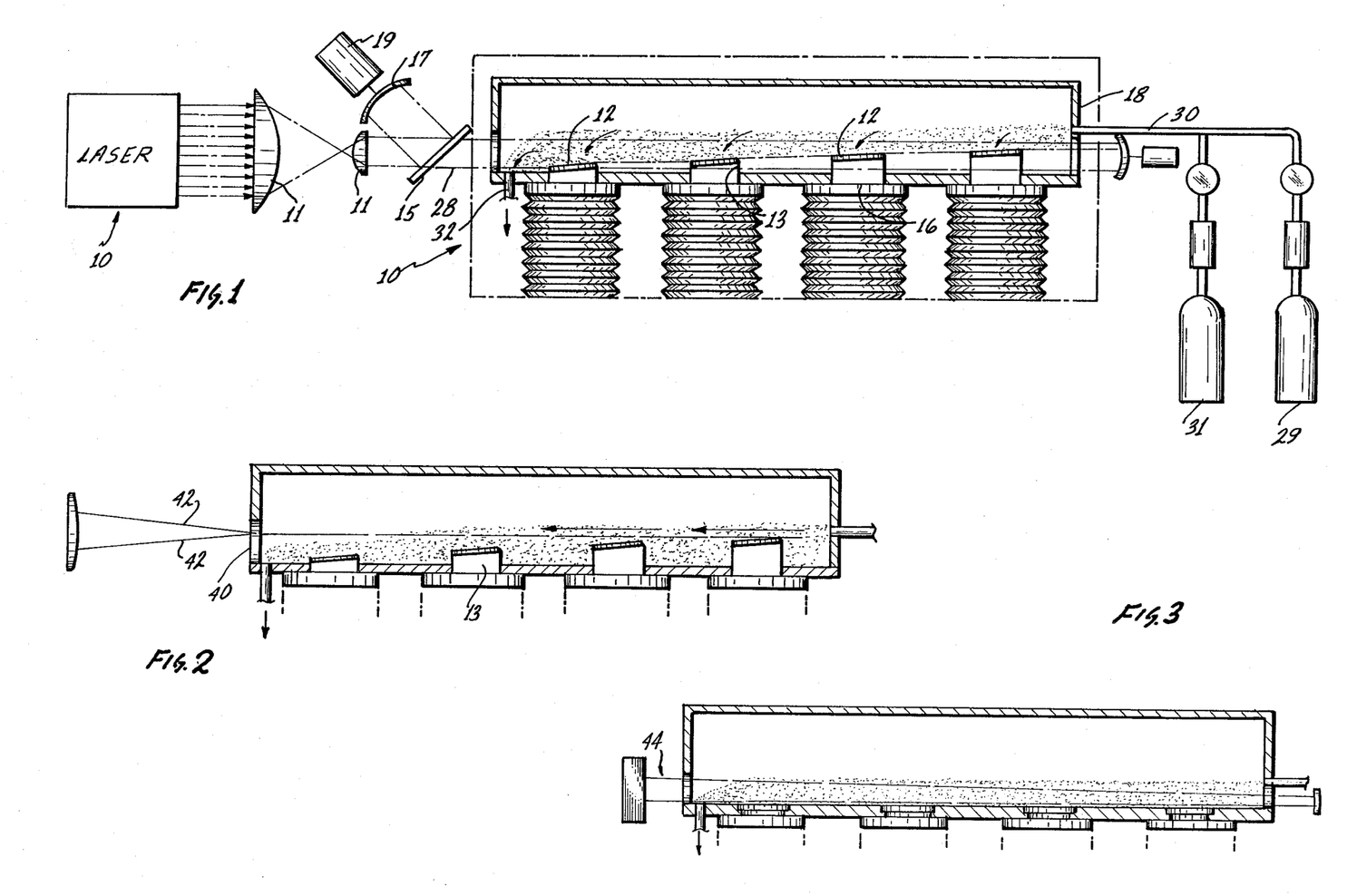
FIG. 1 is a simplified schematic elevational view of apparatus constituting one embodiment of the invention and including members for holding substrates in a chamber in slightly tilted relationship to an energy beam to obtain a substantially uniform deposition of substances on substrates in the chamber.
FIG. 2 is a simplified schematic elevational view of apparatus constituting a second embodiment of the invention and including members for producing an energy beam with a magnitude having a tapered configuration in space to obtain a substantially uniform deposition of substances on substrates in the chamber.
FIG. 3 is a simplified schematic elevational view of apparatus constituting a third embodiment of the invention and including members for producing an energy beam with an envelope having a tapered configuration in space to obtain a substantially uniform deposition of substances on substrates in the chamber.

Although the nozzle 30 and the orifice 32 in FIG. 1 are displaced from each other in the direction of the light beam 28, it will be appreciated that the nozzle and the orifice may be disposed in a direction transverse to that shown in FIG. 1. For example, the inlet nozzle 30 may be disposed at one lateral end of the chamber 18 and the orifice 32 may be disposed at the opposite lateral end of the chamber.

When the beam 28 of substantially coherent light is directed through the chamber 18 toward the substrates 12, it energizes molecules of the donor gases introduced into the chamber through the nozzle 30. This causes the donor gases to form the substance (such as silicon dioxide) which becomes deposited on the substrates 12.

The substrates 12 may be moved relative to the light beam 28. For example, the subtrates 12 may be moved relative to the light beam in a direction indicated in a direction into and out of the plane of the drawings, particularly when the light beam is not as wide as the substrates. This direction is perpendicular to the direction in which the light beam 28 moves along the substrates 12. The substrates 12 may be also rotated relative to the light beam 28 to insure that the substance will be uniformly deposited on the substrates. For example, the substrates 12 may be incrementally rotated through successive angles of approximately 90° or through any other angle. The incremental rotation of the substrates 12 may be accomplished while the light beam is being directed over the substrates or may be provided alternately with the direction of pulsated energy from the light beam 28 toward the substrates.

Instead of moving the substrates 12, the chamber 18 may be moved. Preferably this movement is transverse to the direction of the light beam 28. However, this movement may occur in the direction of the light beam or opposite the direction of the light beam. Alternatively, the light beam 28 may be reciprocated in the transverse direction to control the deposition of the substance on the substrates. The reciprocation of the light beam 28 may be provided by directing the light from the beam splitter 15 to a mirror substantially parallel to the beam splitter 15 and by reciprocating the mirror in a direction toward and away from the beam splitter 15.

Figure 13:
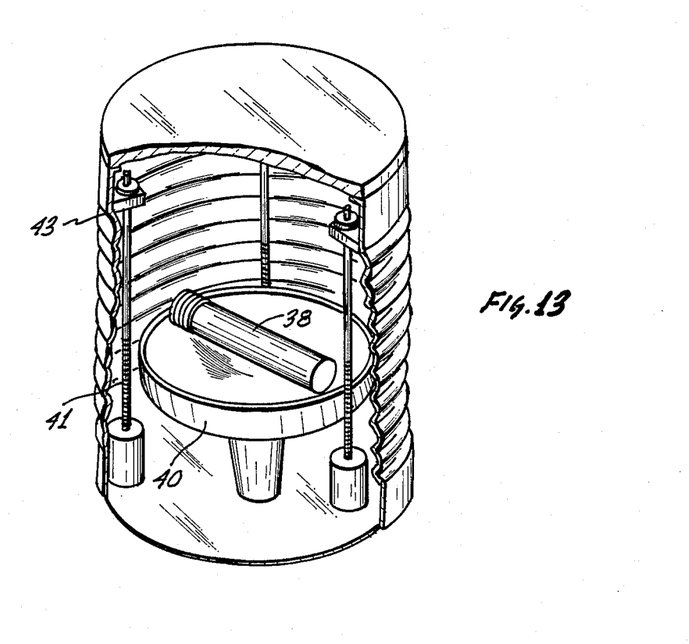
FIG. 13 is an elevational view, partly in elevational section, of members for providing an auxiliary energy beam which may be included in all of the embodiments shown in the previous Figures.

Energy may be directed to the substrates in a direction substantially perpendicular to the substrates to facilitate the ionization of the donor gases and the formation of the substance and the deposition of the substance on the substrates. This energy may be provided by a mercury light source or a xenon flashlamp, both being indicated schematically at 38 in FIG. 13. The light from the source 38 is directed to a parabolic reflector 39 which directs the beam substantially uniformly only to the surfaces of the substrates 12 in the chamber 18. In this way, the light is effective only on the substrates, thereby minimizing any tendency for the substance to become deposited on the walls of the chamber 18 between the substrates. The disposition of each substrate 12 relative to the light beam 28 may be individually provided by adjusting threaded rods 41 relative to nuts 43 as shown in FIG. 13.

As the light beam 28 moves along the substrates 12, it may lose energy. This may result in part when the light beam energizes the molecules of the donor gases to disassociate such molecules for the production of the substance from such disassociated molecules. This loss of energy may prevent the substance from being uniformly deposited on the substrates 12 in the chamber 18. Compensations may be provided in other parameters for the loss of energy in the beam so that the substance will be deposited at a substantially constant rate on all of the substrates 12 in the chamber 18. These different compensations in such other parameters will be discussed in detail subsequently and are included in different embodiments of the invention.

One form of compensation is to dispose the substrates 12 at a slightly inclined angle such as approximately five degrees (5°) relative to the light beam 28 as shown in FIG. 1. Each of the substraes 12 is disposed at this angle along a ramp also inclined at this angle of approximately 5°. This causes the distance between the light beam 28 and the substrates 12 to decrease progressively with progressive movement of the light beam 28 through the chamber 18. In this way, any loss of energy in the light beam 28 at progressive positions along the beam in the chamber 18 is compensated by the reduced distance of the beam from the substrates. This causes the energy needed to deposit the substance on the substrates 12 to become correspondingly reduced.

The loss of energy in the light beam 28 at progressive positions along the substrates 12 may also be compensated by varying the intensity of the beam at different positions in a direction substantially perpendicular to the direction in which the beam is propagated in FIG. 2. This perpendicular direction corresponds to the perpendicular direction in FIG. 2. As will be seen in FIG. 2, the intensity of the light beam 28 is at a maximum at the axial center 40 of the beam. The intensity of the light beam 28 decreases progressively with progressive distances from the axial center of the light beam. This is indicated at 42 in FIG. 2.

The slope of the intensity curve in the area 42 of progressively decreasing intensity corresponds to the slope at which the substrates 12 are disposed in the chamber 18. This causes the intensity of the light beam 28 to remain substantially constant relative to the substrates 12 as the light beam moves through the chamber 18. As a result, the rate of deposition of the substance on the substrates 12 is substantially constant regardless of the relative positioning of the substrates in the chamber.

FIG. 3 illustrates another embodiment for compensating for the progressive weakening in the intensity of the light beam 28 as the beam passes through the chamber 18. In the embodiment shown in FIG. 3, a beam generally indicated at 44 is tapered. The taper of the beam may correspond to the rate at which the intensity of the energy beam decreases as the beam passes through the chamber 18. By tapering the beam 44, the beam tends to become progressively concentrated adjacent the surfaces of the substrates 12. This enhances the ionization of the gases at positions adjacent the substrates 12, the combination of the ions to form the substance and the deposition of the substance on the surfaces of the substrates.

The taper of the beam 44 has been varied dependent upon the rate at which the beam has become weakened as it has traversed the chamber 18. For example, the taper has been varied in some instances from a height of approximately seven millimeters (7 mm) at the front end of the chamber 18 to approximately six millimeters (6 mm) at the rear end of the chamber. In other instances, the taper of the beam 44 has been varied from a height of approximately seven millimeters (7 mm) at the front end of the chamber 18 to approximately two millimeters (2 mm) at the rear end of the chamber.

The direction and the rate of flow of the ionizable gases can also be varied to compensate for the progressive weakening of the energy beam as the beam moves through the chamber 18. For example, when the taper of the energy beam varies only from a height of approximately seven millimeters (7 mm) at the front end of the chamber to approximately six millimeters (6 mm) at the rear end of the chamber, this may not be sufficient in itself to comensate for the progressive weakening in the intensity of the beam. Additional compensation may accordingly be provided by obtaining a controlled flow of ionizable gases from the front end of the chamber 18 to the rear end of the chamber. This is indicated by an arrow 48 in FIG. 4. Under such circumstances, the gases ionized near the front end of the chamber continue to move toward the rear end of the chamber after ionization and to form the substance toward the rear of the chamber. This causes the substance to become deposited on the subtrates at the rear end of the chamber at a greater rate than at the front end of the chamber, thereby compensating for the increased intensity of the beam at the front end of the chamber relative to the intensity of the beam at the rear end of the chamber. The rate of flow of the gases can be controlled to assure that the substance becomes substantially uniformly deposited on the substrates 12.

Figure 5:
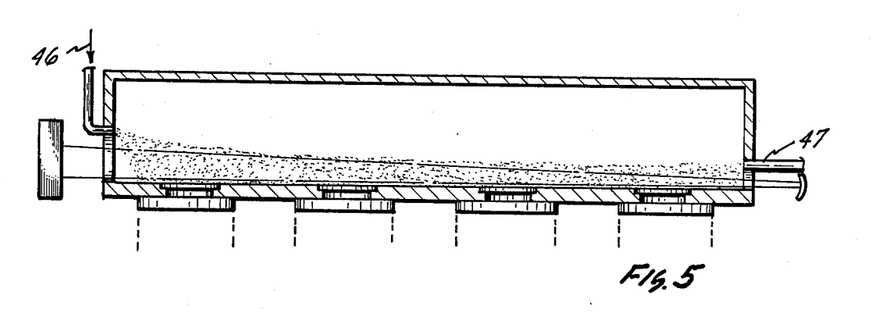
FIG. 5 is a simplified schematic elevational view of apparatus constituting a fifth embodiment of the invention and including members for providing an energy beam with an envelope having a tapered configuration in space and members for introducing gases into the chamber from the other end of the chamber to combine with the beam to deposit a substance substantially uniformly on substances in the chamber.

FIG. 5 also shows an embodiment in which the direction and rate of a neutralizing gas can be controlled to achieve a substantially uniform deposition of the substance on the substrates 12. In FIG. 5, the neutralizing gas is directed from the front of the chamber toward the rear of the chamber through a nozzle 46 and is withdrawn from the chamber through an orifice 47 at the front of the chamber. The neutralizing gases accordingly have their optimal effect at the front of the chamber in inhibiting the ionization of the ionizable gases, the formation of the substance from the ionized gases and the deposition of the substance on the substrates 12 in the chamber 18. This compensates for the fact that the energy beam tapers only from a height of approximately seven millimeters (7 mm) at the front end of the chamber 18 to approximately six millimeters (6 mm) at the rear end of the chamber. This embodiment is particularly effective when the ionizing gases are introduced into the chamber 18 at the front end of the chamber and are withdrawn from the chamber at the rear end of the chamber.

Compensations may also be provided in the direction and rate of gas flows in the chamber 18 when the height of the light beam 28 is tapered from approximately seven millimeters (7 mm) at the front end of the chamber to approximately two millimeters (2 mm) at the rear end of the chamber. For example, the ionizing gases may be directed from the rear end of the chamber 18 toward the front end of the chamber and may be exhausted from the front end of the chamber because of the concentration of the light beam at the rear end of the chamber. The ionized gases move toward the front end of the chamber before they react to form the substance, which then becomes deposited on the substrates 12. In this way, more of the substance tends to become deposited on the substrate 12 toward the front end of the chamber than toward the rear end of the chamber, thereby compensating for the increased concentration of the light beam toward the rear end of the chamber.

When the height of the light beam 28 tapers from approximately seven millimeters (7 mm) at the front end of the chamber 18 to approximately two millimeters (2 mm) at the rear end of the chamber, the neutralizing gas such as nitrogen may be passed through the chamber from the rear end of the chamber to the front end of the chamber. This causes the neutralizing gas to have a greater effect at the rear end of the chamber in inhibiting the ionization of the ionizable gases than at the front end of the chamber. This compensates for the considerably increased strength of the light beam 28 at the rear end of the chamber 18 than at the front end of the chamber.

Figure 6:
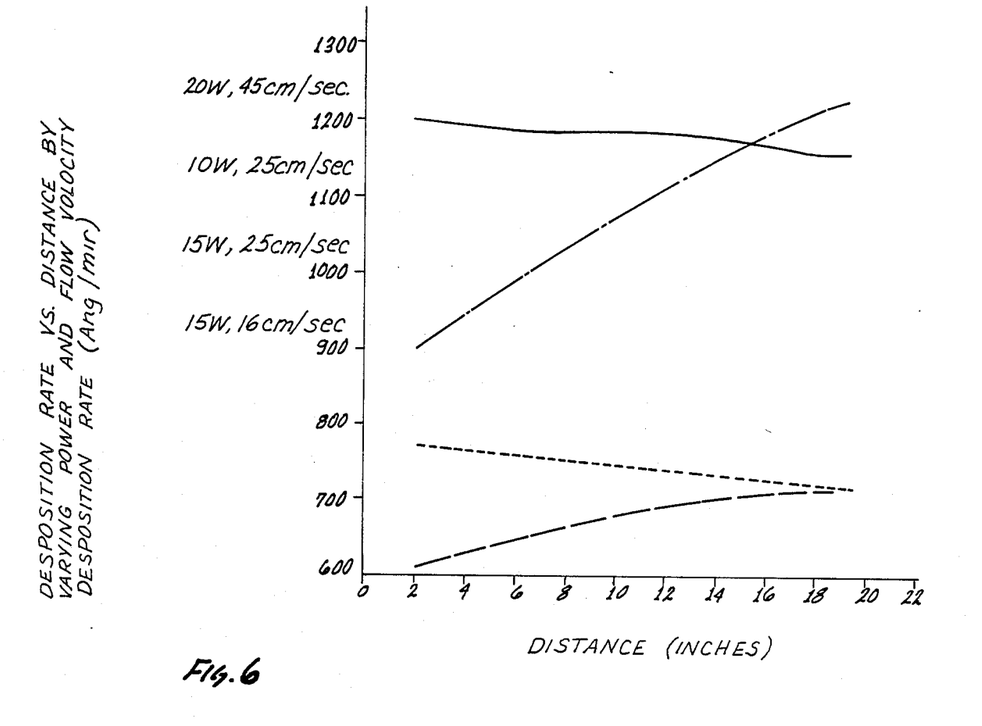
FIG. 6 shows graphs illustrating the deposition rate of a substance at different distances along an energy beam for individual intensities of beam energy and individual rates of gas flow.

FIG. 6 illustrates the effect of different parameters on the rate at which the substance is deposited on the substrates at different positions in the chamber 18. As will be seen, the rate of deposition of the substance on the substrates 12 in substantially constant for two (2) of the examples shown in FIG. 6. These are represented by (1) a magnitude of approximately twenty (20) watts from the light beam 28 and a rate of flow of ionizable gases of approximately forty five centimeters per second (45 cm/sec) and (2) a magnitude of approximately fifteen (15) watts for the light beam 28 and a rate of flow of ionizable gases of approximately twenty five centimeters per second (25 cm/sec). For example 1, the substance such as silicon dioxide becomes deposited on the substrates 12 in the chamber 18 at a rate of approximately twelve hundred angstrom per minute (1200 Å/min). For example 2, the substance such as silicon dioxide becomes deposited on the substrates 12 in the chamber 18 at a rate of approximately seven hundred and fifty angstroms per minute (750 Å/min).

Figure 4:
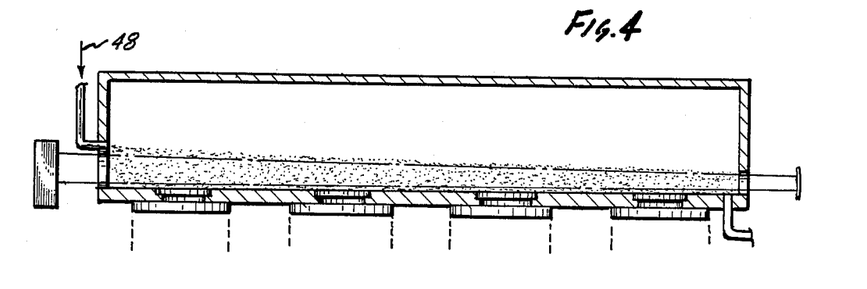
FIG. 4 is a simplified schematic elevational view of apparatus constituting a fourth embodiment of the invention and including members for providing an energy beam with an envelope having a tapered configuration in space and members for introducing gases into the chamber from one end of the chamber to combine with the beam to deposit a substance substantially uniformly on substrates in the chamber.
Figure 7:
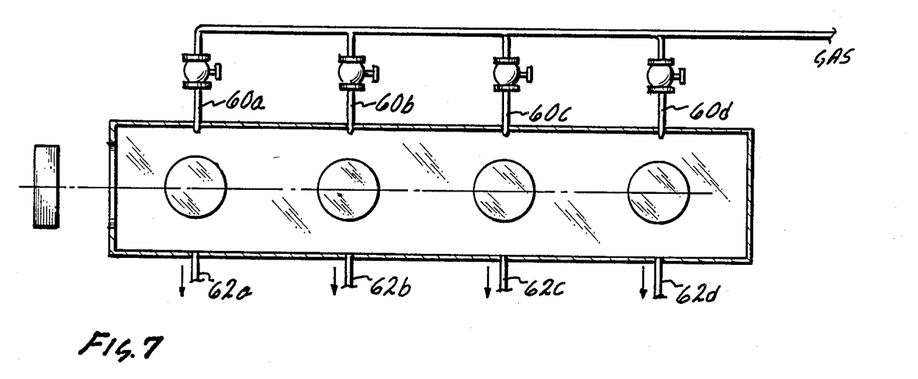
FIG. 7 is a simplified schematic plan view of apparatus constituting a sixth embodiment of the invention and including members for providing an adjustable rate of flow of ionizable gases past individual substrate in a chamber.

In the embodiments shown in FIGS. 4 and 5 and described above, gases are passed through the chamber 18 either in the direction of the light beam 28 or in a direction opposite to the direction of the light beam 28. FIG. 7 illustrates an arrangement in which the ionizable gases are passed through the chamber 18 in a direction transverse (preferably perpendicular) to the direction of the light beam 28. For example, the ionizable gases may be introduced into the chamber 18 through inlets such as inlets 60a, 60b, 60c and 60d and may be exhausted from the chamber 18 through outlets such as outlets 62a, 62b, 62c and 62d. The inlet 60a and the outlet 62a may be disposed adjacent a first one of the substrates 12 in the chamber 18 and the successive pairs of the inlets and outlets may be disposed adjacent progressive ones of the substrates 12 in the chamber 18.

The apparatus shown in FIG. 7 and described above has certain important advantages. For example, the rate of flow through each of the inlets can be individually adjusted to compensate for the progressive weakening in the strength of the light beam 28 as the light beam moves through the chamber 18. As an illustrative example, the successive ones of the inlets 60a, 60b, 60c and 60d may be progressively opened to provide an increased rate of flow of the ionizable gases past each of the successive substrates 12 in the chamber 18. This compensates for the progressive loss in the intensity of the beam energy as the beam 28 moves through the chamber 18. This may be illustratively seen in FIG. 8, which indicates the distance in the chamber 18 along the horizontal axis and the rate of deposition of the substance on the substrates 12 at these progressive distances. As will be seen, the rate of deposition of the substance on the substrates 12 is substantially constant at progressive positions in the chamber 18 even though the intensity of the light beam 28 decreases at such progressive positions and the pressure (or rate of flow) of an ionizable gas such as nitrous oxide increases at such progressive positions. Alternatively, the outlets 62a, 62b, 62c and 62d may be controlled to affect the rates at which the ionizable gas is exhausted from the chamber 18 by each individual one of such outlets.

Figure 8:
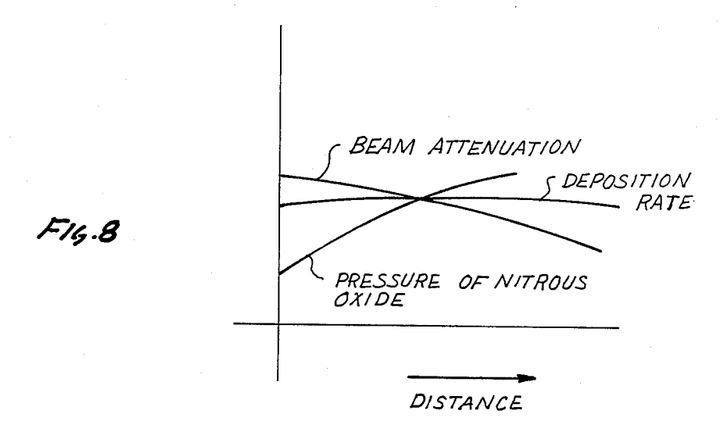
FIG. 8 is a curve schematically illustrating how the pressure of ionizing gases at different positions in a chamber can produce a constant deposition of a substance on substrates at such different positions even when the power of the energizing beam varies at such different positions because of the progressive weakening of the energy beam as the beam moves through the chamber.
Figure 9:
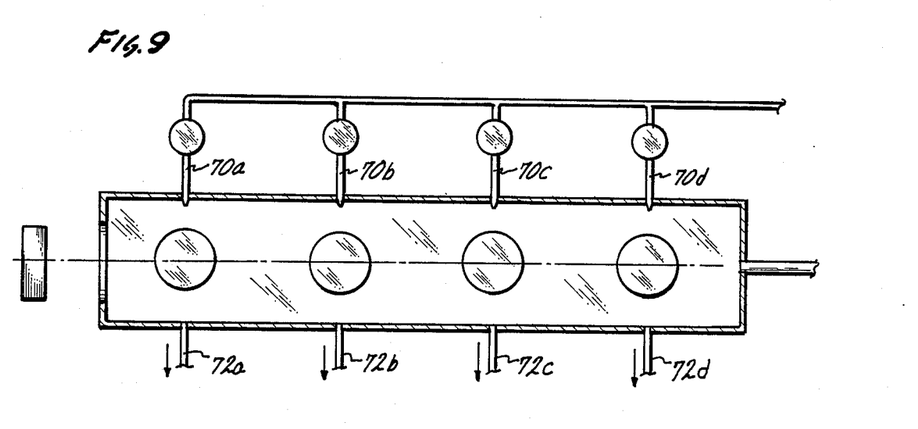
FIG. 9 is a simplified schematic plan view of apparatus constituting a seventh embodiment of the invention and including members for providing an adjustable rate of flow of neutralizing gas past individual substrates in a chamber.

FIG. 9 is a view similar to that shown in FIG. 8. However, in FIG. 9, a neutralizing gas such as nitrogen is introduced into the chamber 18 through inlets such as inlets 70a, 70b, 70c and 70d and is exhausted from the chamber through outlets such as outlets 72a, 72b, 72c and 72d. In the embodiment shown in FIG. 9, the rate of flow of the neutralizing gas is progressively reduced through each of the successive inlets 70a, 70b, 70c and 70d. Alternatively, the outlets 72a, 72b, 72c and 72d may be controlled to affect the rate at which the neutralizing gas is exhausted from the chamber 18 by each individual one of such outlets. The neutralizing gas effectively dilutes the ionizable gases. In this way, the embodiment shown in FIG. 9 can be considered to be the inverse of the embodiment shown in FIG. 7 since the effect of the ionizable gases in the embodiment of FIG. 9 is effectively increased at progressive positions in the chamber 18 by decreasing the amount of the neutralizing gas at these progressive positions. It will be appreciated, however, that the embodiments shown in FIGS. 7 and 9 can be combined into a single operative unit.

Figure 10:
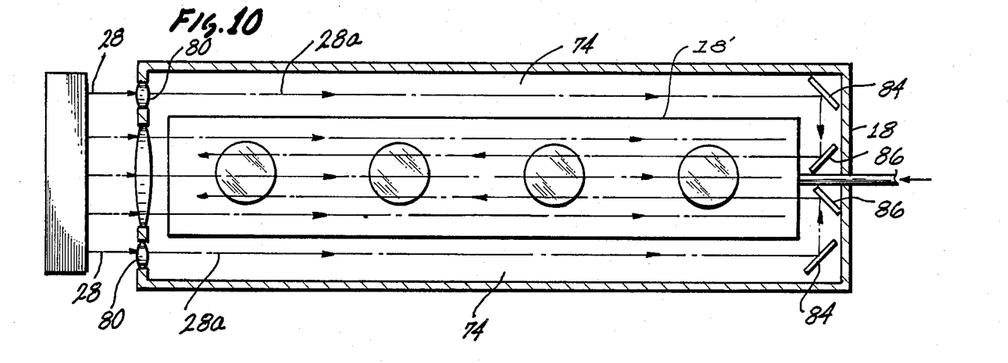
FIG. 10 is a simplified schematic plan view of apparatus constituting an additional embodiment of the invention and including members for providing a movement of a first portion of an energy beam in a first direction past aligned substrates in a chamber and for providing a reflection of another portion of the energy beam past the aligned substrates in a second direction opposite to the first direction.

FIG. 10 illustrates another arrangement for compensating for the loss of energy in the light beam 28 as the light beam traverses the chamber 18. In the embodiment shown in FIG. 10, the light beam 28 is wider than the lateral width of an inner first compartment 18' of the chamber 18. However, the light beam 28 has peripheral portions 28a which are outside of the lateral dimensions of the chamber 18. Lenses 80 are disposed to intercept the beam portions 28a and to focus the light in these beam portions. The focussed beam portions 28a then move along the chamber 18 in areas 74 of a second compartment outside of, but adjacent, the first compartment of the chamber. Preferably the areas 74 are provided with a vacuum which are filled with a neutralizing gas such as nitrogen. The beam portions 28a then become reflected by mirrors 84 and 86 to enter the inner compartment at the far end of the chamber. The beam portions 28a then pass through the inner compartment 18 in a direction opposite to the direction of the main portion of the beam 28. The beam portions 28a may be controlled so that their combined intensities are substantially equal to the main portion of the beam. In this way, the averaged intensity of the light beam at every position in the chamber 18 is substantially constant. As will be appreciated, any one of the compensating arrangements shown in the previous Figures and described above may be included in the embodiment shown in FIG. 10.

Figure 11:
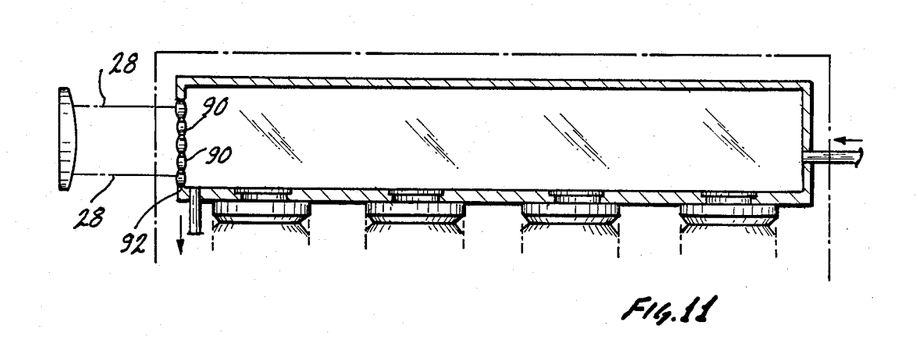
FIG. 11 is a simplified schematic elevational view of apparatus constituting a further embodiment of the invention and including members for providing for a movement of energy beam through a window in a chamber and for the focusing of the beam by lenses in the window.

FIG. 11 illustrates another embodiment of the invention. In this embodiment, lenses 90 are disposed in a window 92 to focus the light beam 28 as the light beam passes through the window into the chamber 18. For example, the lenses 90 may be included in the window 92 to taper the light beam 28 in a manner similar to that discussed above and shown in FIG. 3. The lenses 90 may also be provided with properties to converge the light beam 28 to the lateral width of the chamber 18. By providing the lenses 90 in the window 92, the focussing of the beam 28 can be provided at the front end of the chamber 18 rather than at positions before the chamber. As will be appreciated, any individual one or combination of the compensating arrangements shown in the previous Figures and described above may be included in the embodiment shown in FIG. 11.

Figure 12:
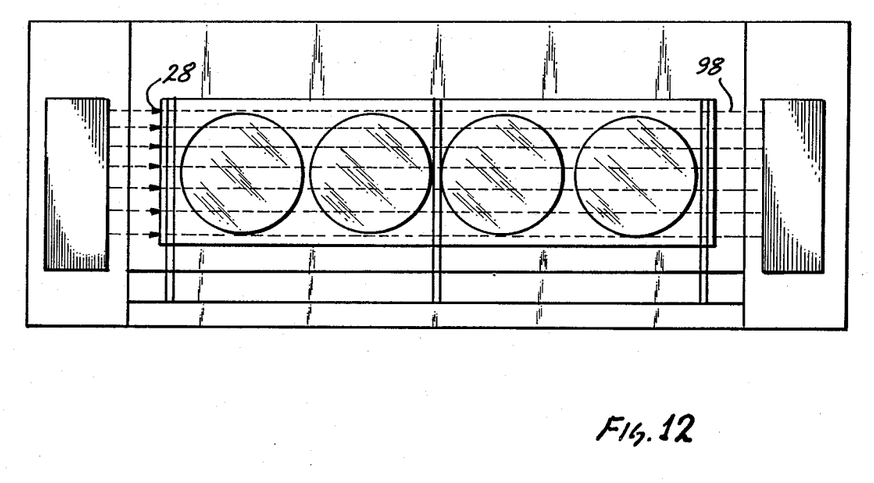
FIG. 12 is an elevational view, partly in section, of apparatus constituting an additional embodiment of the invention.

FIG. 12 illustrates an additional embodiment of the invention. The embodiment shown in FIG. 12 includes the light beam 28. This is shown as being directed into the chamber from the left end of the chamber. In the embodiment shown in FIG. 12, a beam 98 is directed into the chamber 18 from the end of the chamber 18 opposite to that of the beam 28. The beam 98 is provided with characteristics substantially identical to those of the beam 18. In this way, the two beams are averaged to produce a substantial uniform intensity relative to every position on the substrates in the chamber.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In a combination for providing for the direction of a substance to a surface of a planar substrate to affect the surface of the substrate, means for defining a chamber, means for holding the substrate in the chamber, means for directing a beam of energy along the substrate, the beam having properties of becoming weakened with passage along the substrate, means for introducing ionizable gases into the chamber for ionization by the energy beam and for the formation from the ionized gases of the substance to be directed to the surface of the substrate, means for exhausting the ionizable gases from the chamber after the flow of the ionizable gases through the chamber, and means for compensating, in a single pass of the energy beam along the substrate, for the weakening of the energy beam during the passage of the energy beam along the substrate.

2. In a combination as set forth in claim 1, the compensating means including means for tilting the substrate relative to the energy beam so that the end of the substrate furthest from the energy beam is closer to the energy beam than the end of the substrate closest to the energy beam.

3. In a combination as set forth in claim 2, the compensating means further including means for providing the energy beam with a tapered configuration.

4. In a combination as set forth in claim 1, the compensating means including means for controlling the rate at which the ionizable gases are introduced into the chamber at progressive positions along the substrate.

5. In a combination as set forth in claim 1, the compensating means including means for introducing neutralizing gases into the chamber, and means for controlling the rate at which the neutralizing gases are introduced into the chamber at the progressive positions along the substrate.

6. In a combination as set forth in claim 3, the compensating means including means for controlling the rate of flow of the ionizable gases in the chamber to compensate for the tapered configuration of the energy beam.

7. In a combination as set forth in claim 1, the compensating means including means for localizing energy on the substrate to facilitate the ionization of the ionizable gases by the energy beam.

8. In a combination as set forth in claim 1, the compensating means including means for varying the intensity of the energy beam at the different positions of the beam in a direction constituting a perpendicular cross-section of the beam.

9. In a combination as set forth in claim 1, the compensating means including means for directing a second beam of energy, of substantially identical characteristics to the first beam of energy, into the chamber from the end of the chamber opposite to the first beam of energy.

10. In a combination for providing for a direction of a substance to surfaces of a plurality of substrates to affect such surfaces of such substrates, means for defining a chamber, means in the chamber for holding the substrates in an aligned planar relationship in the chamber, means for introducing into the chamber gases to be ionized to obtain the formation of the substance from the ionized gases and the deposition of the substance on the substrate, means for exhausting the gases from the chamber, means for directing a light beam into the chamer in a direction along and contiguous to the substrates for ionizing the gases in the chamber, the intensity of the light beam becoming weakened by the gases in the chamber as the light beam passes through the chamber, the light beam being disposed relative to the aligned substrates to obtain a substantially uniform direction of the substance to the surfaces of the substrates to compensate for the weakening of the intensity of the light beam by the gases as the light beam passes through the chamber, and means for applying heat uniformly and locally to the substrates to facilitate the direction of the substance to the surfaces of the substrates.

11. In a combination as set forth in claim 10, the substrates being disposed at a shallow acute angle relative to the energy beam to compensate for the weakening in the intensity of the light beam by the gases in the chamber as the light beam moves through the chamber.

12. In a combination as set forth in claim 10, further means for individually regulating the flow of the ionizable gases to each of the substrates in the chamber to compensate for the weakening in the intensity of the light beam by the gases in the chamber as the light beam moves along the substrate.

13. In a combination as set forth in claim 10, means for tapering the width of the beam to compensate for the weakening in the intensity of the light beam by the gases in the chamber as the light beam moves along the substrate.

14. In a combination as set forth in claim 10, the light beam having an axis and the substrates being disposed at a relatively shallow angle relative to the axis of the light beam and the light beam being tapered with progressive displacements of the light beam along the substrates to compensate for the weakening of the intensity of the light beam by the gases in the chamber as the gases pass through the chamber.

15. In a combination as set forth in claim 14, the shallow angle of the substrates relative to the light beam and the taper of the energy beam having a co-operative relationship to provide for a substantially uniform deposition of the substance on the substrates in the chamber by compensating for the weakening of the intensity of the light beam by the gases in the chamber as the light beam passes through the chamber.

16. In a combination as set forth in claim 10, means for including in the gases to be ionized a neutralizing gas having properties of controlling the ionization of the ionizable gases in the resulting gas mixture and means for regulating the amount of the neutralizing gas introduced to each of the substrates to compensate for the weakening in the intensity of the light beam by the gases in the chamber as the light beam moves along the substrates in the chamber.

17. In a combination as set forth in claim 10, the light beam being provided with different intensities at different positions in a direction constituting a perpendicular cross-section of the beam.

18. In a combination for providing for a direction to surfaces of a plurality of substrates of a substance formed from gases so as to affect such surfaces of such substrates,
- means for defining a chamber for holding the substrates and for containing the gases,
- means for directing a beam of substantially coherent energy through the chamber and for tapering the beam at a particular angle with progressive distances through the chamber, the intensity of the beam becoming weakened by the gas in the chamber as the beam passes through the chamber, the particular angle being related to the weakening of the intensity of the beam by the gases in the chamber as the beam passes through the chamber,
- means for introducing the gases into the chamber for ionization by the energy beam and for combination of the ionized gases into the substance and for the direction of the substance to the surfaces of the substrates in the chamber,
- means for exhausting the gases from the chamber after the flow of the gases through the chamber,
- means for heating the substrates to facilitate the direction of the substance to the substrates, and
- means for supporting the substrates in the chamber in an aligned relationship with respect to the energy beam to co-operate with the energy beam for obtaining a substantially uniform direction of the substance to the substrates to compensate for the weakening of the beam as the beam passes through the chamber.

19. In a combination as set forth in claim 18,
the energy beam being tapered at progressive distances through the chamber in the direction of the passage of the energy beam through the chamber, and
the supporting means holding the successive substrates in the chamber at substantially the same angle as the taper in the energy beam.

20. In a combination as set forth in claim 19,
further means for regulating the rate at which the ionizable gases are introduced to each of the substrates in the chamber to compensate for any weakening in the intensity of the energy beam relative to each of the successive substrates in the chamber as the energy beam passes through the chamber.

21. In a combination as set forth in claim 19,
means for regulating the rate at which the ionizable gases flow through the chamber from the introducing means to the exhausting means to co-operate with the supporting means in obtaining a substantially uniform deposition of the substance on the substrates in the chamber.

22. In a combination as set forth in claim 19,
further means for introducing a neutralizing gas into the chamber to control the rate at which the gases become ionized by the energy beam at the different positions in the chamber and to compensate for the weakening in the intensity of the energy beam by the gases in the chamber as the energy beam passes through the chamber.

23. In a combination as set forth in claim 22,
further means for controlling the rate at which the neutralizing gas is introduced into the chamber to compensate for any weakening in the intensity of the energy in the energy beam relative to each of the successive substrates in the chamber as the energy beam passes through the chamber.

24. In a combination as set forth in claim 22,
further means for controlling the rate at which the neutralizing gas is introduced into the chamber at a position adjacent each of the successive substrates in the plurality of substrates to compensate for any weakening in the intensity of the energy beam relative to each of the substrates in the chamber as the energy beam passes through the chamber.

25. In a combination as set forth in claim 18,
the light beam being provided with intensities progressively decreasing from an axially central position toward the opposite limits of the beam configuration and the supporting means holding the substrates at the same angle as defined by the progressive decreases in the intensity of the beam.

26. In a combination for providing for a direction of a substance to surfaces of a plurality of substrates,
- means for defining a chamber,
- means for providing a beam of substantially coherent energy,
- means for directing the beam of substantially coherent energy through the chamber, the beam becoming weakened as the beam passes through the chamber,
- means for disposing the plurality of substrates in the chamber in contiguous relationship to the energy beam for movement of the energy beam along the substrates,
- means for introducing into the chamber a mixture of gases for ionization by the energy beam to form the substance and for direction of the substance to the surface of the substrate,
- means for exhausting the ionizable gases from the chamber after the flow of the ionizable gases through the chamber, and
- means for regulating the rate at which the gases ionize in the chamber to compensate for the weakening in the intensity of the energy beam relative to the substrates in the chamber as the beam passes through the chamber.

27. In a combination as set forth in claim 26,
the regulatory means providing for an individual rate of flow of the ionizable gases in the chamber past each of the substrates in the chamber to obtain a substantially uniform deposition of the substance on the substrates in the chamber.

28. In a combination as set forth in claim 26,
further means for introducing neutralizing gases into the chamber to control the rate at which the ionizable gases in the chamber ionize, and
the regulatory means providing for an individual rate of flow of the neutralizing gases in the chamber past each of the substrates in the chamber.

29. In a combination as set forth in claim 26 wherein the energy beam is tapered and the rate of flow of the gases in the chamber is regulated to co-operate with the taper in the energy beam to obtain a substantially uniform deposition of the substance on the substrates in the chamber.

30. In a combination as set forth in claim 29 wherein the substrates are disposed in a planar relationship relative to one another in the chamber and wherein the energy beam has an axis and wherein the substrates in the chamber are tilted at a relatively small angle relative to the axis of the energy beam and wherein the taper in the energy beam is at substantially the same angle as the tilt of the substrates in the chamber.

31. In a combination for providing for a direction of a substance to surfaces on a plurality of substrates,
    means for defining a chamber,
    means for defining first and second compartments in the chamber,
    means for producing a beam of substantially coherent energy,
    means for directing a first portion of the energy beam through the first compartment in the chamber, the intensity of the first portion of the beam becoming weakened as the first portion of the beam passes through the chamber,
    means for disposing the substrates in the first compartment in the chamber in substantially parallel, and contiguous, relationship to the energy beam,
    means for introducing a mixture of gases into the first compartment in the chamber for ionization by the energy beam and for the formation of the substance from the gases and for the deposition of the substance on the substrates,
    means for exhausting the ionizable gases from the chamber after the flow of the ionizable gases through the chamber,
    means for directing a second portion of the energy beam through the second compartment to a position beyond the substrates in the first compartment, and
    means for directing the second portion of the energy beam, after movement through the second compartment, through the first compartment in a substantially parallel and contiguous relationship to the substrates in the chamber and in a direction opposite to the direction of movement of the first portion of the beam through the first compartment, the intensity of the second portion of the beam becoming weakened as the second portion passes in the opposite direction through the chamber, thereby compensating for the weakening of the intensity of the first portion of the energy beam as the first portion of the energy beam passes through the chamber.

32. In a combination as set forth in claim 31, further means for heating the substrates substantially uniformly to facilitate the ionization of the ionizable gases in the first compartment by the energy beam.

33. In a combination as set forth in claim 31, the portion of the energy beam passing through the compartment having substantially the same intensity as the portion of the energy beam passing directly into the chamber.

34. In a combination as set forth in claim 31,
    means for introducing into the compartment neutralizing gases for controlling the ionization of the ionizable gases.

35. In a combination as set forth in claim 31 wherein the last mentioned means reflect the second portion of the energy beam for movement through the first compartment after the second portion of the energy beam has moved through the second compartment.

36. In a combination for providing for a direction of a substance to surfaces on a plurality of substrates,
    means for defining a chamber,
    means outside the chamber for providing a beam of substantially coherent energy,
    means for defining a window in the chamber for passing the energy beam from outside the chamber into the chamber,
    means for holding the substrates in an aligned relationship in the chamber,
    means included in the window for focussing the energy beam to pass through the chamber in substantially parallel and contiguous relationship to the aligned substrates in the chamber,
    means for introducing into the chamber a mixture of gases for ionization by the energy beam and for the formation of the substance from the ionized gases and for the direction of the substance to the surfaces of the substrates, and
    means for exhausting the gases from the chamber after the passage of the gases through the chamber.

37. In a combination as set forth in claim 36,
    the energy beam being weakened by the gases in the chamber as the energy beam passes through the chamber in substantially parallel and contiguous relationship to the aligned substrates in the chamber,
    means for compensating for the weakening in the intensity of the energy beam as the energy beam moves through the chamber.

38. In a combination as set forth in claim 37, further including,
    a second compartment enveloping a first compartment in the chamber,
    means extending past the window into the second compartment for directing a portion of the energy in the energy beam through the second compartment, and
    means for directing the energy in the second compartment into the first compartment of the chamber in a direction opposite to the direction in which the energy beam moves through the window into the chamber, the last mentioned means directing the energy into the second compartment in a direction substantially parallel, and contiguous, to the substrates in the chamber after the movement of the portion of the energy beam through the second compartment.

* * * * *